(12) United States Patent
Lee et al.

(10) Patent No.: US 8,222,913 B2
(45) Date of Patent: Jul. 17, 2012

(54) PROBE BLOCK

(75) Inventors: Yong Goo Lee, Seoul (KR); Maeng Youl Lee, Seoul (KR)

(73) Assignee: Gigalane Co., Ltd., Suwon-si (KR)

( * ) Notice: Subject to any disclaimer, the term of this patent is extended or adjusted under 35 U.S.C. 154(b) by 0 days.

(21) Appl. No.: 12/674,097

(22) PCT Filed: Jan. 7, 2008

(86) PCT No.: PCT/KR2008/000069
§ 371 (c)(1),
(2), (4) Date: Feb. 18, 2010

(87) PCT Pub. No.: WO2009/025426
PCT Pub. Date: Feb. 26, 2009

(65) Prior Publication Data
US 2011/0031991 A1   Feb. 10, 2011

(30) Foreign Application Priority Data
Aug. 21, 2007   (KR) .................. 10-2007-0084214

(51) Int. Cl.
*G01R 31/00* (2006.01)

(52) U.S. Cl. ........ 324/756.03; 324/756.07; 324/754.043

(58) Field of Classification Search ............. 324/756.03, 324/756.07, 754.03; 439/66
See application file for complete search history.

(56) References Cited

U.S. PATENT DOCUMENTS

| | | | | |
|---|---|---|---|---|
| 5,727,954 A * | 3/1998 | Kato et al. | ...................... | 439/66 |
| 6,043,666 A * | 3/2000 | Kazama | .................. | 324/755.05 |
| 6,404,211 B2 * | 6/2002 | Hamel et al. | ............. | 324/755.06 |
| 6,846,184 B2 * | 1/2005 | Fan et al. | ........................ | 439/66 |
| 6,847,221 B2 * | 1/2005 | Kimoto et al. | ........... | 324/755.06 |
| 7,362,114 B2 * | 4/2008 | Winter et al. | ............. | 324/756.02 |
| 7,404,717 B2 * | 7/2008 | Kazama | ......................... | 439/66 |
| 2005/0225337 A1 * | 10/2005 | Cram | ............................ | 324/754 |

FOREIGN PATENT DOCUMENTS

| KR | 10-0610803 B1 | 7/2006 |
|---|---|---|
| KR | 10-0661254 B1 | 7/2006 |

* cited by examiner

*Primary Examiner* — Arleen M Vazquez
(74) *Attorney, Agent, or Firm* — Stein McEwen, LLP

(57) ABSTRACT

A probe block mounted on a probe card is provided for achieving fine pitch probes. A probe block for a probe card of a semiconductor test device according to the present invention includes a guide member and a probe. A guide member includes pairs of upper and lower holes and middle holes each interconnecting the upper and lower holes of each pair. A probe includes a first pin tip protruded through a corresponding upper hole for contacting a pad of a device to be tested and a second pin tip protruded through a corresponding lower hole for transferring an electrical signal to the device and a bridge part situated within the middle hole for interconnecting the first and second pin tips. The upper, lower, and middle holes allow the probe to elastically moves in vertical direction. The probe block of the present invention is advantageous in that the probes are supported by guide members so as not to be bent while maintaining a fine pitch. Also, the probe block of the present invention is advantageous in fabrication and repair since probes are elastically contacted rather than directly bonded to the circuit substrate of the probe card.

9 Claims, 5 Drawing Sheets

[Fig. 1]
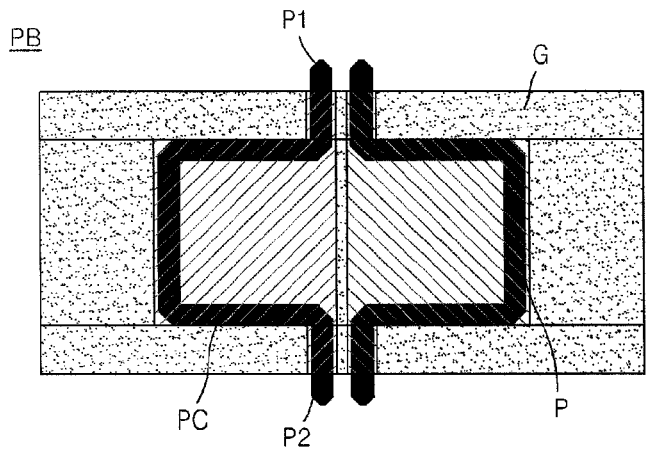
[Fig. 2]
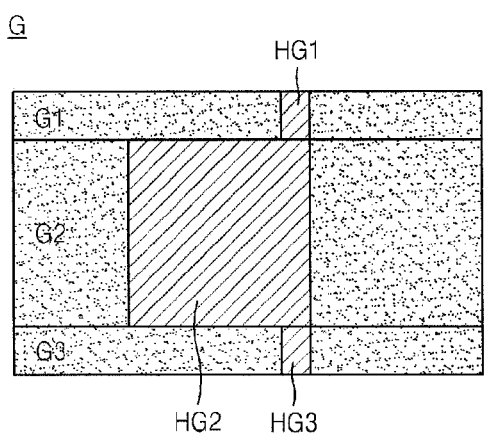
[Fig. 3]
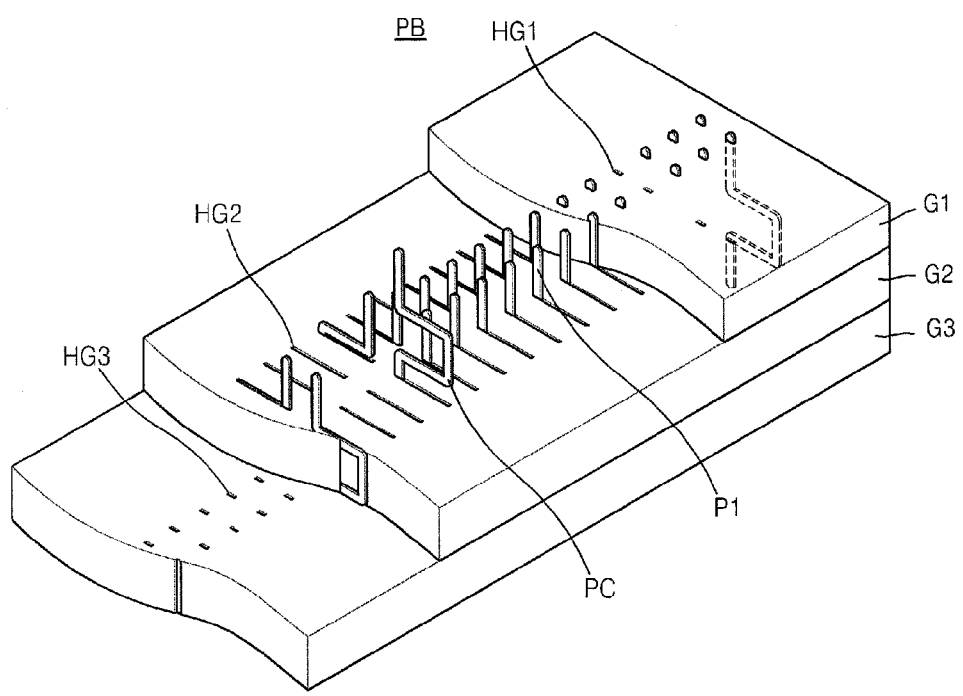

[Fig. 4]
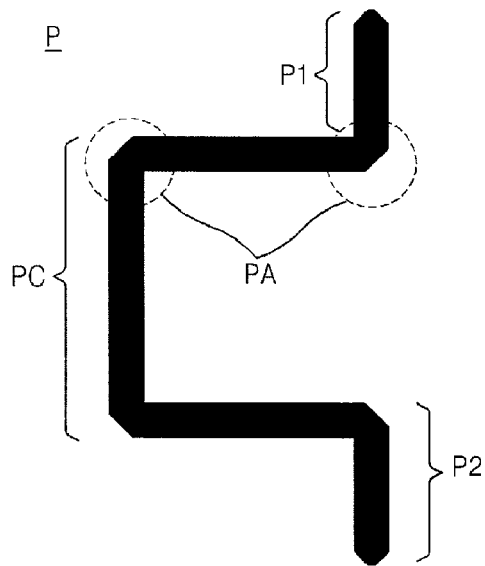
[Fig. 5]
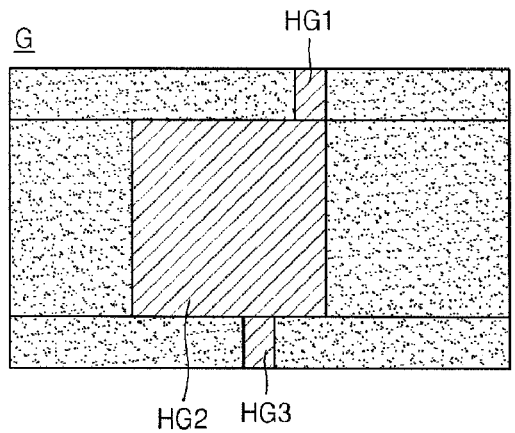
[Fig. 6]
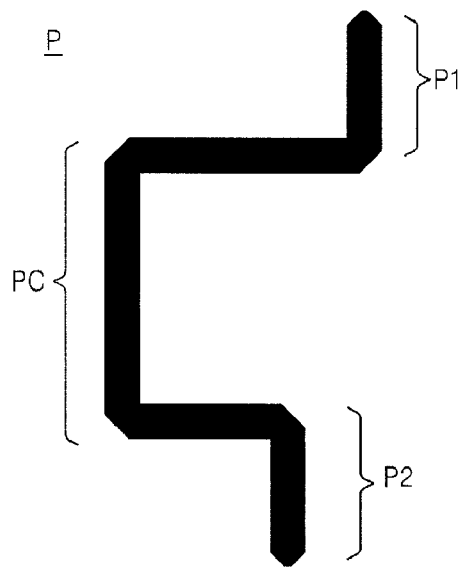

[Fig. 7]
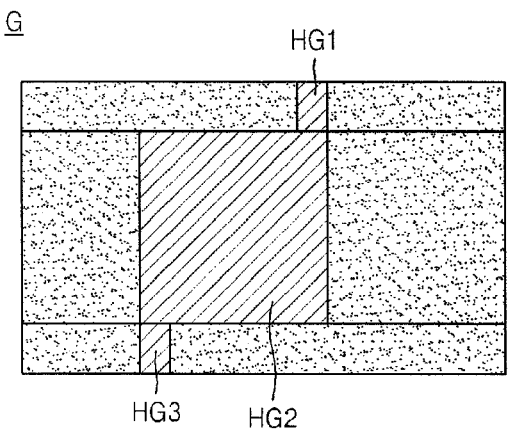
[Fig. 8]
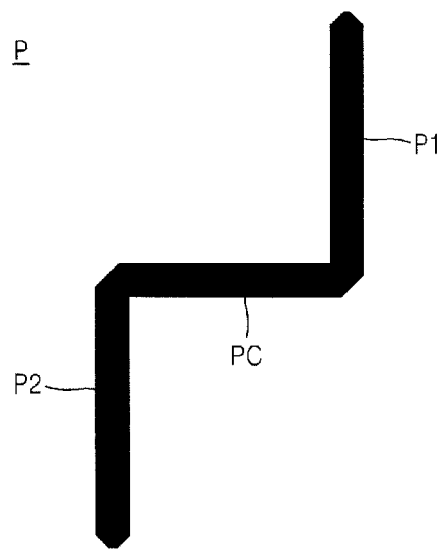
[Fig. 9]
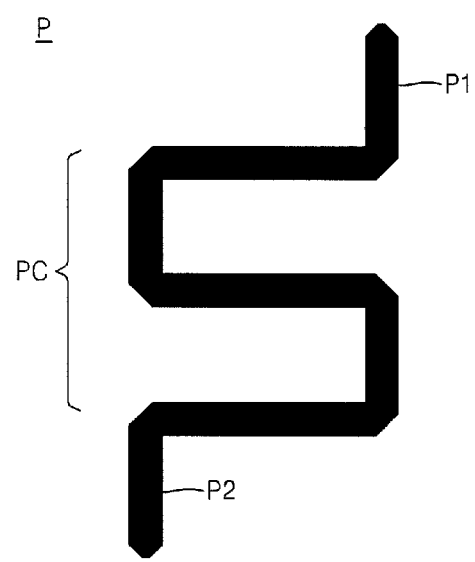

[Fig. 10]
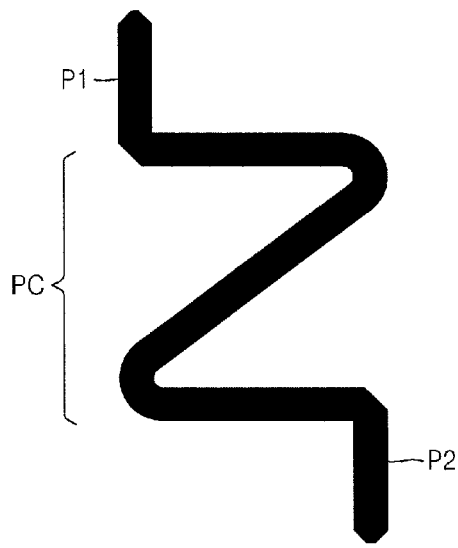
[Fig. 11]
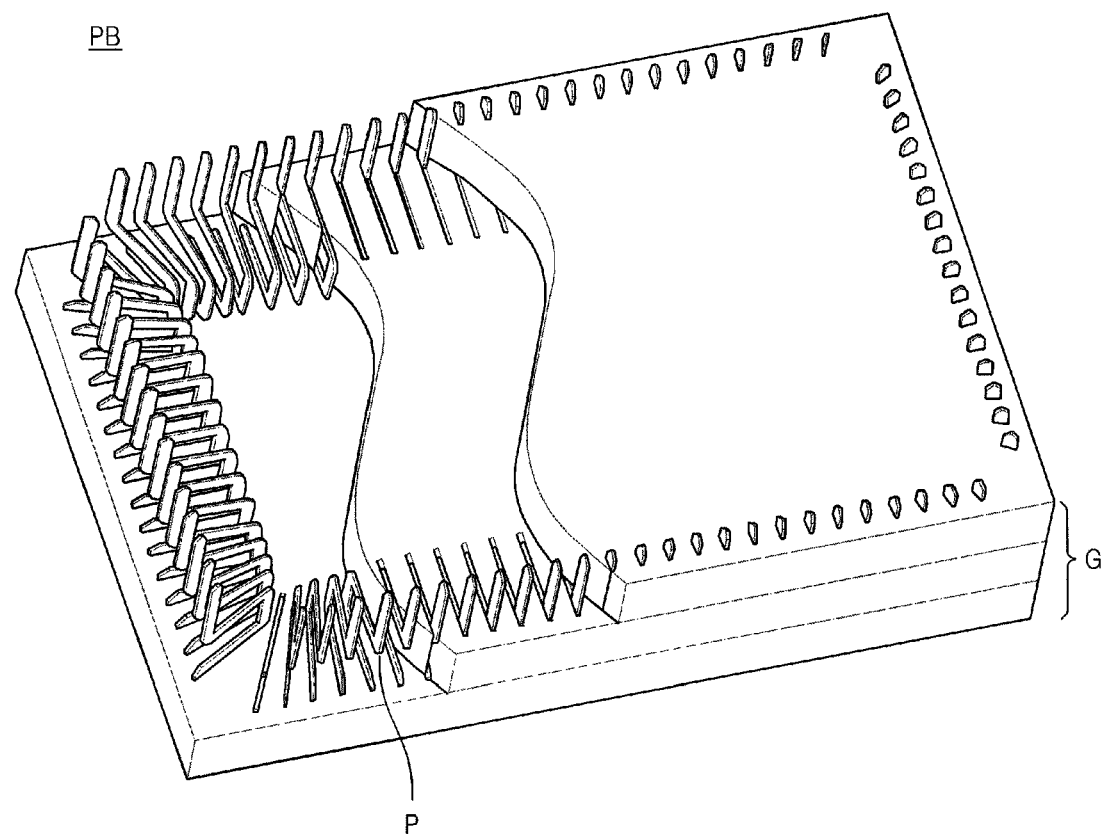

[Fig. 12]
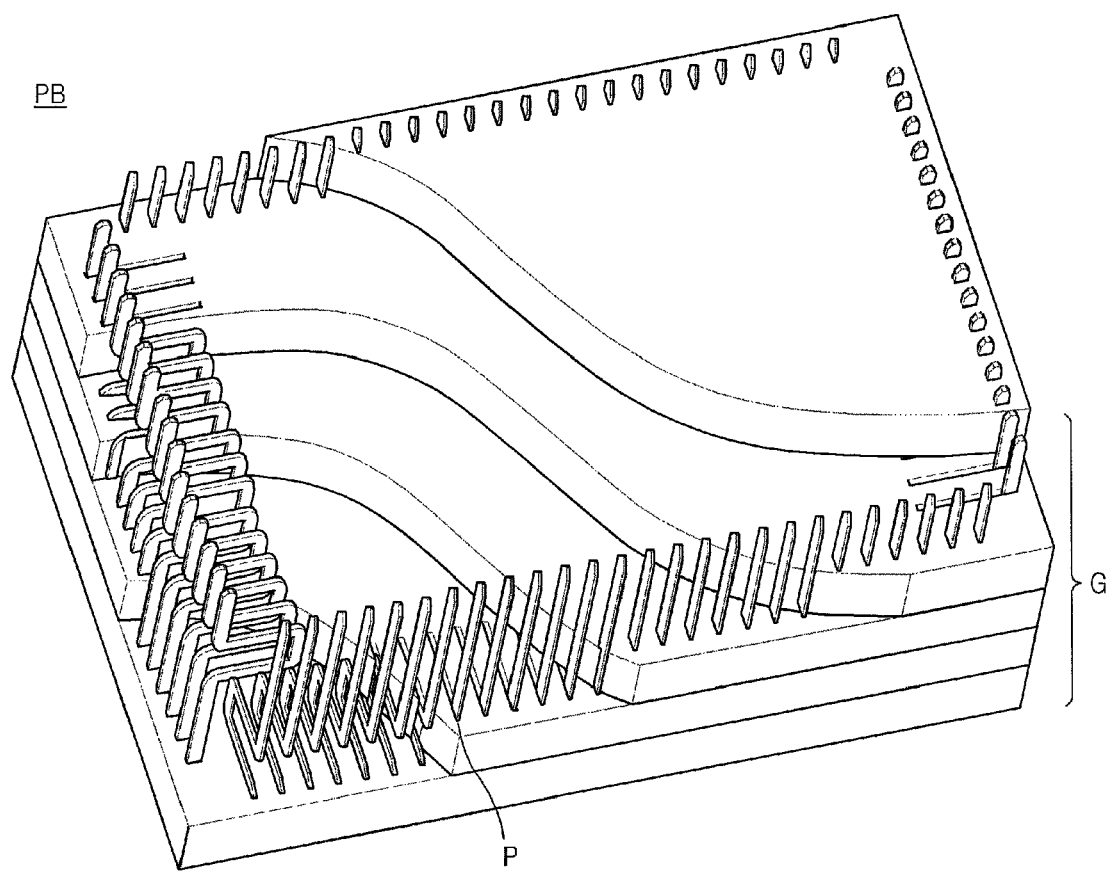

PROBE BLOCK

This is a National Phase Application filed under 35 U.S.C. 371 as a national stage of PCT/KR2008/000069, filed on Jan. 7, 2008, an application claiming foreign priority benefits under 35 USC 119 of Korean Application No. 10-2007-0084214, filed on Aug. 21, 2007, the content of each of which is hereby incorporated by reference in its entirety.

TECHNICAL FIELD

The present invention relates to a semiconductor test apparatus and, in particular, to a probe block mounted on a probe card that are capable of implemented with fine pitch.

BACKGROUND ART

A semiconductor test apparatus is used to test electrical characteristics of chips fabricated on a wafer.

When fabricating semiconductor chips on a wafer are completed, the chips are tested during or after fabrication process or before packaging process for evaluating their designed electrical characteristics partially or entirely.

A probe station is one of the most popular tools for making measurements on the integrated circuits. The probe station is provided with a probe card holder for holding a probe card which applies electric signal to pads of the chips formed on the wafer.

Typically, the probe card is composed of a printed substrate and a plurality of probes mounted on the printed substrate. The printed substrate has a circuitry for electrically connecting probing devices and the probes. The probes are contacted the pads of the chips to be tested.

The wafer placed on a chuck is moved along the x-axis and y-axis to be aligned on the probe card such that the probes are positioned on the respective pads of the chips. And then, the chuck moves in z-axis such that the tips of the probes contact the pads of the chips.

The chips are tested by transmitting electrical signals generated by probe station to the tips via electric wires patterned on the printed substrate.

Recently, with the advance of semiconductor technology, device pads are arranged in various forms of arrays below a few micrometers in pitch.

As the number of parallel tests of the devices increase, the number of probes increase and, in turn, the area occupied by the device array increases, whereby alignment of the contact is becoming more critical factor for accurate contact with the pad small in size and pitch.

DISCLOSURE OF INVENTION

Technical Problem

The present invention has been made in an effort to solve the above problems, and it is an object of the present invention to provide a fine-pitch probe block using thin plate type vertical probes.

Technical Solution

In accordance with an aspect of the present invention, the above and other objects are accomplished by a probe block for a probe card of a semiconductor test device. The probe block includes a guide member having pairs of upper and lower holes and middle holes each interconnecting the upper and lower holes of each pair; and a plurality of probes each comprising a first pin tip protruded through a corresponding upper hole for contacting a pad of a device to be tested and a second pin tip protruded through a corresponding lower hole for transferring an electrical signal to the device and a bridge part situated within the middle hole for interconnecting the first and second pin tips, wherein the upper, lower, and middle holes allow the probe to elastically moves in vertical direction.

Preferably, the bridge part includes at least on bent portion for allowing the first pin tip to elastically move when contacting the pad.

Preferably, the middle hole receives the bridge part of the probe for allowing movement of the pin tips only in vertical direction.

Preferably, the upper, lower, and middle holes securing a single probe are formed on an identical sectional plane. Preferably, the upper and lower holes of each pair are coaxially formed.

In accordance with another aspect of the present invention, the above and other objects are accomplished by a probe block mounted on a probe card of a semi-conductor test apparatus. The probe block includes a guide member having pairs of upper and lower holes formed on respective upper and lower surfaces and middle holes each interconnecting the upper and lower holes of each pair, the middle hole being larger than the upper and lower holes; and a plurality of probes situated along the upper, middle, and lower holes of the guide member for contacting a chip to be tested.

Preferably, the middle hole is formed in the shape of a slit for receiving a bridge part of the probe and the upper and lower holes are formed on the same sectional plane with the middle hole.

Preferably, the upper and lower holes are coaxially formed.

Preferably, the probe comprises a first pin tip protruded through the upper hole for contacting a chip pad to be tested.

a second pin tip protruded through the lower hole for receiving a test signal to be transferred to the first pin tip, and a bridge part situated in the middle hole for interconnecting the first and second pin tips.

Preferably, the bridge part comprises at least one bent portion.

Advantageous Effects

The probe block of the present invention is advantageous in that the probes are supported by guide members so as not to be bent while maintaining a fine pitch.

Also, the probe block of the present invention is advantageous in fabrication and repair since probes are elastically contacted rather than directly bonded to the circuit substrate of the probe card.

BRIEF DESCRIPTION OF THE DRAWINGS

FIG. 1 is a cross sectional view illustrating a probe block according to an exemplary embodiment of the present invention;

FIG. 2 is a partial cross sectional view of a left half of a guide member of the probe block of FIG. 1;

FIG. 3 is a perspective sectional view of the probe block of FIG. 1;

FIG. 4 is an enlarged side view illustrating the probe of the probe block of FIG. 1;

FIG. 5 is a cross sectional view illustrating a guide member of a probe block according to another exemplary embodiment of the present invention;

FIG. 6 is a side view illustrating a probe paired with the guide member of FIG. 5;

FIG. 7 is a cross sectional view illustrating a guide member of a probe block according to another exemplary embodiment of the present invention;

FIG. 8 is a side view illustrating a probe paired with the guide member of FIG. 7;

FIG. 9 is a side view illustrating a probe paired with the guide member of FIG. 7 according to another exemplary embodiment of the present invention;

FIG. 10 is a side view illustrating a probe of the probe block according to another exemplary embodiment of the present invention;

FIG. 11 is a perspective sectional view illustrating a probe block according to an exemplary embodiment of the present invention; and FIG. 12 is a perspective sectional view illustrating a probe block according to an exemplary embodiment of the present invention.

BEST MODE FOR CARRYING OUT THE INVENTION

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

FIG. 1 is a cross sectional view illustrating a probe block according to an exemplary embodiment of the present invention, and FIG. 2 is a partial cross sectional view of a left half of a guide member of the probe block of FIG. 1.

A plurality of probe block (PB) are mounted on a probe card (not shown), and each probe block is aligned so as to make an electrical contact between a pad of a corresponding chip and a pad of circuit substrate.

Referring to FIGS. 1 and 2, the probe block (PB) mounted on a probe card of a semi-conductor test apparatus according to an embodiment of the present invention is provided with a guide member (G) and at least one probe (P).

Each of left and right half part of the guide member (G) is provided with an upper hole (HG1) formed on its upper surface and a lower hole (HG3) formed on its lower surface, and a middle hole (HG2) interconnecting the upper and lower holes (HG1 and HG3), the upper and lower holes being formed in the same contour and smaller than the middle hole.

The probe (P) is seated along the upper, center, and lower holes such that a first pin tip (P1) of the probe (P) is protruded through the upper hole (HG1) and the second pin tip (P2) is protruded through the lower hole (HG3). The first and second pin tips (P1 and P2) are interconnected through a bridge part (PC) having a shape of "⊏" which is secured within the middle hole (HG2) such that the probe bridge part (PC) can bend elastically only in a vertical direction.

FIG. 3 is a perspective sectional view of the probe block of FIG. 1, and FIG. 4 is an enlarged side view illustrating the probe of the probe block of FIG. 1.

Referring to FIG. 3, the guide member (G) is formed such that a plurality of probes (P) are secured and supported by the guide member (G).

Preferably, the guide member (G) is a silicon (Si) substrate. The guide member (G) can be made of gallium arsenide (GaAs), ceramic, Quartz, glass, or plastic material. The guide member (G) can be fabricated using a dry or wet etching process, sawing process, and laser process. The middle hole (HG2) of the guide member (G) is formed in a shape of narrow slit such that the bridge part (PC) of the probe (P) can elastically move in vertical direction but not in horizontal direction. The upper and lower holes (HG1 and HG3) are elongated from the middle hole (HG2) to top and bottom surface of the guide member (G).

The shape of the probe (P) can be modified according to the positions of the upper and lower holes (HG1 and HG3).

Referring to FIGS. 2 and 3, the guide member (G) is formed by bonding three layered-substrates (G1, G2, and G3) How to fabricate the guide member (G) is described hereinafter.

The three layered-substrates (G1, G2, and G3) of the substrate are provided with respective upper, center, and lower holes (HG1, HG2, and HG3). The upper holes (HG1) of the upper layer substrate (G1), the middle holes (HG2) of the middle layer substrate (G2), and the lower holes (GH3) of the lower layer substrate are formed by an etching or laser cutting technique. After the holes (HG1, HG2, and HG3) are formed on the respective substrates (G1, G2, and G3), the substrates are sequentially laminated.

The substrates (G1, G2, and G3) can be bonded using an adhesive tape, fusion bonding technique, or anodic bonding technique. Also, the substrates (G1, G2, and G3) can be mechanically bonded using bolts or rivets.

Although the guide member (G) is formed by laminating three sub-substrates (G1, G2, and G3) in drawings, a number of the sub-substrates are not limited to 3. For example, the guide member (G) can be manufactured by laminating two sub-substrates. In this case, each sub-substrate is formed to have a stepped hole such that the two sub-substrates are bonded to define the upper, middle, and lower holes.

Due to the support of the guide member (G), each probe (P) is not bent in horizontal direction, resulting in achievement of fine pitch. Although the probe pitch may change depending on the material, bonding scheme, and lamination structure, the probes can be arranged with a pitch below 50 μm.

It is obvious to those skilled in the art that the pin tips of the probe (P) can formed in various shapes according to the size, material, thickness, contact force, shape of the pad of a chip.

The bridge part (PC) of the probe (P) is formed having at least one bent portion (PA) such that the first pin tip (P1) can elastically moves, when it contact the pad (not shown) of the chip, in vertical direction as shown in FIG. 4. How the bridge part (PC) can be modified is described later.

In this embodiment, the probe (P) of the probe block (PB) is restricted in its movement in x-axis and y-axis directions but not in z-axis direction, thereby scrubbing can be controlled by adjusting the hole size and resulting in minimization of damage of the pad. The intervals between the probes along the x-axis and y-axis can be adjusted in the range of margin space between the probe (P) and guide member (G).

Since the movement of the probe (I) is restricted in z-axis direction by the guide member (G), it is possible to protect the probe (F) from being damaged. In FIGS. 1 to 4, the probe (P) is formed a shape of "⊏" having perpendicular protrusions at both ends and situated inside the guide member (G). Particularly, the upper and lower holes (HG1 and HG3) of the guide member (G) are formed along the same vertical axis. However, the shapes of the holes and probes can be modified.

FIG. 5 is a cross sectional view illustrating a guide member of a probe block according to another exemplary embodiment of the present invention, and FIG. 6 is a side view illustrating a probe paired with the guide member of FIG. 5.

Referring to FIG. 5, the upper hole (HG1) and the lower hole (HG3) are formed along different y-axes, while the two holes are formed on the same sectional plane with the middle hole (HG2).

The probe (P) of FIG. 6 is formed so as to be situated in along the holes (HG1 to HG3). As a result, the first and second pin tips are protruded in opposite directions along the different y-axes.

FIG. 7 is a cross sectional view illustrating a guide member of a probe block according to another exemplary embodiment of the present invention, FIG. 8 is a side view illustrating a probe paired with the guide member of FIG. 7, and FIG. 9 is a side view illustrating a probe paired with the guide member of FIG. 7 according to another exemplary embodiment of the present invention.

Referring to FIG. 7, the upper and lower holes (HG1 and HG3) are formed at opposite ends of the middle hole (HG2) in horizontal direction on the same sectional plane. The guide member (G) of FIG. 7 can receive the probe formed as shown if FIGS. 8 and 9.

As shown in FIGS. 5 and 7, the upper and lower holes (HG1 and HG3) can be formed at any positions in the range of horizontal width of the middle hole (HG2), respectively. Although the bridge part (PC) of the probe (P) is formed in a shape "- -" in FIG. 8 and "己" in FIG. 9, the bridge part can be modified in various shapes as well as it can be situated in the middle hole (HG2).

FIG. 10 is a side view illustrating a probe of the probe block according to another exemplary embodiment of the present invention.

In FIG. 10, the probe is provided with the first and second pin tips (P1 and P2) that are formed at opposite positions of those in FIGS. 8 and 9. Also, the bridge part has a shape of Z. Although not shown in drawings, the guide member (G) can be modified to receive the probe (P) of FIG. 10.

FIG. 11 is a perspective sectional view illustrating a probe block according to an exemplary embodiment of the present invention.

Unlike probe block of FIG. 3 in which the probes (P) are arranged along a center line of the probe blocks, the probes (P) are arrange along edges of the probe block in FIG. 11. The probe block configured as in FIG. 3 is used for testing devices arranged in a line-on-center pattern. That is, the probes (P) can be arranged for testing devices arranged in peripheral type pad. FIG. 12 is a perspective sectional view illustrating a probe block according to an exemplary embodiment of the present invention.

Unlike the probe block (PB) of FIG. 11 in which the guide member (G) is composed of three substrates, the guide member (G) is formed by laminating five substrates in FIG. 12.

Although the probe blocks (PB) depicted in FIGS. 11 and 12 are configured in a probe pattern appropriate for peripheral pad array device, the probe block can be configured in various pad array device. As described above, the probe block of the present invention is configured such that the guide member secures and supports the probes (P) In the probe block of the present invention, the upper and lower holes (HG1 and HG3) are formed at any positions in the range of horizontal width of the middle hole (HG2), and the bridge part (PC) of the probe (P) can be formed in various shapes. By arranging the probes in various patterns, the probe block of the present invention can be adapted for testing electrical characteristics of chips having various pad arrays.

The probe block is mounted on a probe card of a semiconductor test apparatus according to the present invention is provided with a guide member having pairs of upper and lower holes and middle holes each interconnecting the upper and lower holes of each pair and probes situated along the holes.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

INDUSTRIAL APPLICABILITY

The probe block of the present invention can be applied to probe cards used in various semiconductor test apparatuses.

The invention claimed is:

1. A probe block for a probe card of a semiconductor test device, comprising:
    a guide member having pairs of upper and lower holes and middle holes each interconnecting the upper and lower holes of each pair; and
    a plurality of probes each comprising a first pin tip protruded through a corresponding upper hole and a second pin tip protruded through a corresponding lower hole and a bridge part situated within the middle hole for interconnecting the first and second pin tips, wherein at least one of the first pin tip, the second pin tip, and the bridge part is substantially flat, and at least one of the first pin tip and the second pin tip extends substantially straightly,
    wherein the upper, lower, and middle holes allow the probe to elastically moves in vertical direction,
    wherein a width of the middle holes is greater than a width of the upper holes and than a width of the lower holes, each of the middle holes being defined by a first horizontal surface, a second vertical surface, and a third horizontal surface, and
    wherein the bridge part includes a first bridge part extending substantially along the first horizontal surface of the middle hole, a second bridge part extending substantially along the second vertical surface of the middle hole, and a third bridge part extending substantially along the third horizontal surface of the middle hole.

2. The probe block of claim 1, wherein the bridge part comprises at least one bent portion for allowing the first pin tip to elastically move.

3. The probe block of claim 1, wherein the middle hole receives the bridge part of the probe for allowing movement of the pin tips only in vertical direction.

4. The probe block of claim 1, wherein the upper, lower, and middle holes securing a single probe are formed on an identical sectional plane.

5. The probe block of claim 4, wherein the upper and lower holes of each pair are coaxially formed.

6. A probe block mounted on a probe card of a semiconductor test apparatus, comprising:
    a guide member having pairs of upper and lower holes formed on respective upper and lower surfaces and middle holes each interconnecting the upper and lower holes of each pair; and
    a plurality of probes situated along the upper, middle, and lower holes of the guide member, wherein each probe comprises a first pin tip protruded through the upper hole, a second pin tip protruded through the lower hole, and a bridge part situated in the middle hole for interconnecting the first and second pin tips, wherein at least one of the first pin tip, the second pin tip, and the bridge part is substantially flat, and at least one of the first pin tip and the second pin tip extends substantially straightly, wherein a width of the middle holes is greater than a width of the upper holes and than a width of the lower holes, each of the middle holes being defined by a first horizontal surface, a second vertical surface, and a third horizontal surface, and wherein the bridge part includes a first bridge part extending substantially along the first horizontal surface of the middle hole, a second bridge part extending substantially along the second vertical surface of the middle hole, and a third bridge part extending substantially along the third horizontal surface of the middle hole.

7. The probe block of claim 6, wherein the middle hole is formed in the shape of a slit for receiving a bridge part of the probe and the upper and lower holes are formed on the same sectional plane with the middle hole.

8. The probe block of claim 7, wherein the upper and lower holes are coaxially formed.

9. The probe block of claim 6, wherein the bridge part comprising at least one bent portion.

* * * * *